United States Patent [19]

Bergeron et al.

[11]  4,326,212
[45]  Apr. 20, 1982

[54] STRUCTURE AND PROCESS FOR OPTIMIZING THE CHARACTERISTICS OF I²L DEVICES

[75] Inventors: David L. Bergeron, Manassas; Zimri C. Putney, Fairfax; Geoffrey B. Stephens, Catlett, all of Va.

[73] Assignee: IBM Corporation, Armonk, N.Y.

[21] Appl. No.: 69,645

[22] Filed: Aug. 27, 1979

Related U.S. Application Data

[63] Continuation of Ser. No. 855,869, Nov. 30, 1977, abandoned.

[51] Int. Cl.³ .................... H01L 27/04; H03K 19/081
[52] U.S. Cl. ........................................ 357/46; 357/89; 357/91; 357/92
[58] Field of Search ...................... 357/35, 36, 44, 46, 357/92, 89

[56]  References Cited

U.S. PATENT DOCUMENTS

| 3,704,399 | 11/1972 | Glaise | 357/35 |
| 3,878,551 | 4/1975 | Callahan, Jr. | 357/35 |
| 3,945,857 | 3/1976 | Schinella et al. | 357/44 |
| 3,993,513 | 11/1976 | O'Brien | 357/92 |
| 4,058,419 | 11/1977 | Tokumaru et al. | 357/92 |
| 4,064,526 | 12/1977 | Tokumaru et al. | 357/92 |

OTHER PUBLICATIONS

Mulder et al, IEEE J. of Solid State Circuits, vol. SC 11, No. 3, Jun. 1976, pp. 379-385.
Hennig et al, IEEE J. of Solid-State Circuits, vol. SC 12, No. 2, Apr. 1977, pp. 101-109.

Primary Examiner—William D. Larkins
Attorney, Agent, or Firm—John E. Hoel

[57]  ABSTRACT

An improved I²L structure and process are disclosed which reduces the minority carrier charge storage, increases the emitter injection efficiency and reduces the emitter diffusion capacitance in the upward injecting vertical NPN transistor and reduces the minority carrier charge storage and increases the collector efficiency in the lateral PNP transistor. This is accomplished by ion-implanting a p-type region in the epitaxial layer, through an insulating layer on the surface having an emitter window over the vertical NPN transistor, so that its concentration contour peak follows the contour of the insulating layer so as to be closer to the subemitter in the intrinsic base region than in the extrinsic base region of the vertical transistor, thereby imposing a concentration gradient induced electric field in the intrinsic base region which will aid in the movement of the minority carrier charges from the buried emitter into the intrinsic base region of the vertical transistor while at the same time reducing the tendency of the minority carriers to stay in the region of the epitaxial layer between the subemitter and the base in the vertical NPN and between the buried N region and the collector region of the lateral PNP.

2 Claims, 10 Drawing Figures

STRUCTURE AND PROCESS FOR OPTIMIZING THE CHARACTERISTICS OF I²L DEVICES

This is a continuation, division, of application Ser. No. 885,869 filed 11/30/77, now abandoned.

FIELD OF THE INVENTION

The invention generally relates to semiconductor manufacturing processes and more particularly relates to a process for forming improved bipolar transistors.

BACKGROUND OF THE INVENTION

Integrated Injection Logic (I²L), otherwise known as, merged transistor logic (MTL), integrated circuits employ upward injection vertical bipolar transistors and lateral PNP transistors. A problem in the prior art is the poor injection efficiency of the emitter for the upward injecting vertical transistor and the excessive charge storage in its emitter base region. This results in the requirement of a larger collector to compensate for the low injection efficiency and longer switching times due to excessive charge storage.

C. Mulder, et al "High Speed Integrated Injection Logic," *IEEE Journal of Solid State Circuits,* June 1976, p. 379, discloses the use of a low dose, high energy boron implant to extend the base region to the N+ subemitter to minimize the N− region and thereby lower charge storage in the emitter base junction. However, he does not differentiate between the extrinsic and the intrinsic base regions, and therefore, Mulder, el al does not have the ability to alter the base profile to favor the diffusion of electrons in the intrinsic base without adversely influencing injection and capacitance in the extrinsic base.

Copending U.S. patent application Ser. No. 792,277, assigned to the instant assignee, by F. H. DeLaMoneda, entitled "Process for Fabrication of MTL Cells," discloses an N+ substrate emitter, a p-epi, recessed oxide, n-type lateral base region, n+ collectors with a p-type implant whose doping profile is tailored by the thickness of the oxide/nitride masking layer to have its entire doping profile within the N+ substrate emitter under the intrinsic base and adjacent to the N+ substrate in the extrinsic base. The DeLaMoneda application works well for its intended purpose, and minimizes the emitter charge storage problem by using p-type epi, but this compromise degrades the conventional NPN device. The DeLaMoneda application solves the problem of unwanted minority carrier injection into the extrinsic base by increasing the extrinsic base doping profile. However, it cannot alter the base profile in the intrinsic base in order to aid diffusion of electrons and decrease diffusion capacitance therein, since such a tailoring would cause the lateral PNP to be shorted between its collector and emitter. In addition, self-alignment between the implanted contour and the collector cannot be achieved in the DeLaMoneda application while at the same time tailoring the implant to lie below his N base region 24 since it would be necessary that the N base region 24 be devoid of the passivation layer during the ion-implantation step and subsequently reoxidized in order to passivate that region with his oxide 20 (or 40 in his third embodiment). Thus, a self-aligned upward collector and buried implantation region, which is essential for a dense, high performance device, cannot be achieved by the DeLaMoneda application.

OBJECTS OF THE INVENTION

It is therefore an object of the invention to provide an improved injection efficiency for the emitter of an upward injecting vertical transistor, in an improved manner.

It is another object of the invention to provide a reduced charge storage characteristic in the emitter-base region of an upward injecting vertical transistor, in an improved manner.

It is still another object of the invention to provide an increased injection efficiency for the emitter and a reduced charge storage characteristic for the emitter-base junction of an upward injecting vertical transistor.

It is yet another object of the invention to reduce the resistivity in the extrinsic base region and to increase the injection efficiency in the intrinsic base region, in an improved manner.

It is still a further object of the invention to improve the collector efficiency of a double diffused, lateral transistor, in an improved manner.

It is another object of the invention to provide an MTL transistor which has a reduced collector area and a higher manufacturing yield, in an improved manner.

SUMMARY OF THE INVENTION

These and other objects are accomplished by the improved merged transistor logic (I²L) process and structure disclosed herein. An improved MTL structure and process are disclosed which reduces the minority carrier charge storage, increases the emitter injection efficiency and reduces the emitter diffusion capacitance in the upward injecting vertical NPN transistor and reduces the minority carrier charge storage and increases the collector efficiency in the lateral PNP transistor. This is accomplished by ion-implanting a p-type region in the epitaxial layer, through an insulating layer on the surface having an emitter window over the vertical NPN transistor, so that its concentration contour peak follows the contour of the insulating layer so as to be closer to the subemitter in the intrinsic base region than in the extrinsic base region of the vertical transistor, thereby imposing a concentration gradient induced electric field in the intrinsic base region which will aid in the movement of the minority carrier charges from the buried emitter into the intrinsic base region of the vertical transistor while at the same time reducing the tendency of the minority carriers to stay in the region of the epitaxial layer between the subemitter and the base in the vertical NPN and between the buried N region and the collector region of the lateral PNP. The invention disclosed here improves the injection efficiency of the emitter for the vertical transistor and reduces the charge storage in its base region by imposing a concentration gradient induced electric field in the intrinsic base region which effectively sweeps out free charges which would otherwise reside therein. The collector efficiency of the lateral, double diffused PNP formed simultaneously with the vertical NPN transistor, is also increased since the previously described ion-implantation step extends the p-type collector region, increasing its collecting area.

DESCRIPTION OF THE FIGURES

These and other objects will be more fully understood with reference to the accompanying drawings.

DISCUSSION OF THE PREFERRED EMBODIMENT

An improved integrated injection logic (I$^2$L) process and structure is disclosed which provides a practical technique for reducing the minority carrier charge storage in, and increasing the emitter injection efficiency of an upward injecting NPN transistor. An I$^2$L structure is formed in N epi with selective photoresist masking, selective oxidation and ion-implantation up through the formation of the contact windows and ion-implanted regions leaving a region of lightly doped N epi between the buried subemitter and the NPN base. This spacing between the base and buried N+ region is required in order to sustain a sufficiently high collector-emitter voltage for other transistors on the same substrate operating in the normal mode. This N− epi region is compensated in the I$^2$L transistor by selectively masking with photoresist and ion-implanting boron such that the peak of the implanted profile follows the contour of the surface, and is deeper under the open contact regions, particularly under the NPN collectors. The energy of the boron implant is chosen such that the peak lies at the edge of the buried subemitter and the upper half of the boron implant profile compensates the N+ epi region, while the deeper half of the boron implant profile is compensated by the buried N+ emitter. The net p-type base region profile is thus graded in the direction to aid injection of electrons from the buried emitter. At the same time, the areas which are covered with the oxide/nitride layers will have the peak of the boron implant profile penetrate the silicon a lesser distance, thereby placing the peak midway between the p base and N+ emitter such as to retard the injection of electrons and reduce the emitter-base charge storage in these oxide/nitride covered regions. The lateral collector area of the merged double diffused lateral PNP is increased by extending the NPN base region vertically to the N+ buried region, thereby increasing the collector efficiency and overall current gain of the PNP.

A semiconductor fabrication process and structure is described for simultaneous formation of high performance NPN and PNP transistors with improved charge storage and upward injection characteristics. The invention makes use of the surface contour of an integrated circuit structure to self-align a variable depth, ion-implanted region in order to enhance injection and reduce charge storage in the merged transistor structure. The process is compatible with Schottky Barrier Diodes (SBD), and conventionally operating transistors since only the I$^2$L transistors need be affected by the boron implant.

Figure 1A:
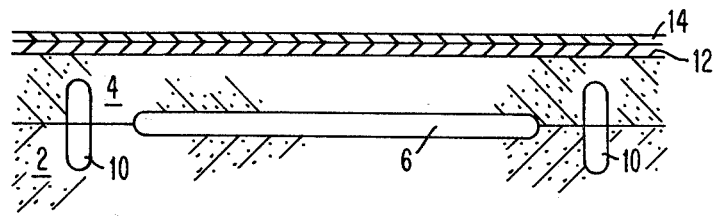
FIG. 1a is a cross-sectional view of a first intermediate stage of the I²L device with a conventional buried N+ region, P+ bottom isolation, and N-Epi formation, followed by SiO$_2$ oxidation and Si$_3$N$_4$ deposition.

In FIG. 1a, the process follows conventional masking, doping (diffusion or ion-implant) and deposition techniques to form the N+ 6 and P+ 10 buried regions, N-epitaxial layer 4, on substrate 2, epi reoxidation 12, and Si$_3$N$_4$ layer 14.

Figure 1B:
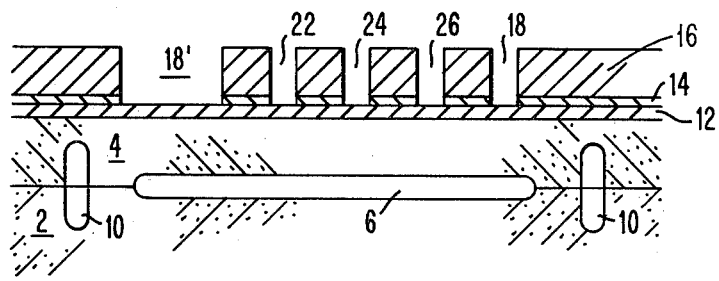
FIG. 1b is a cross-sectional view of a second stage opening all contacts, N guard ring and PNP base regions through the Si$_3$N$_4$ layer.
Figure 1C:
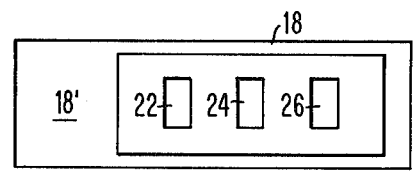
FIG. 1c is a top view of the second intermediate stage opening of all contacts, N guard ring, PNP base regions through the Si$_3$N$_4$ layer.

In FIG. 1b, the windows for the guard ring 18, PNP base region 18' and all contact holes 22, 24, 26, are etched (reactive ion etching preferred) through Si$_3$N$_4$ 14 using photoresist mask 16. FIG. 1c shows a top view of this mask.

Figure 1D:
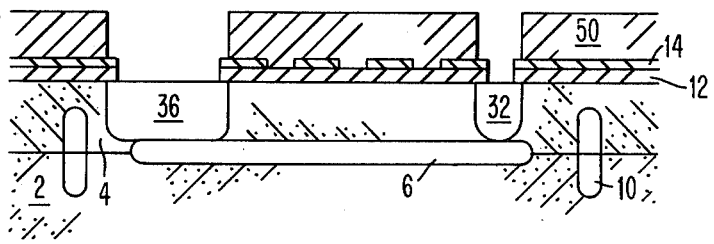
FIG. 1d is a cross-sectional view of a third stage, after FIGS 1b and 1c, showing the N guard ring and PNP base photoresist blocking layer and implant, forming the N guard ring, PNP base regions, and buried N+ region contact.

In FIG. 1d, the next mask defines a PR blockout mask 50 for the oxide etch and N phosphorous implant which serves as reachthrough contact 36 to the N+ buried layer 6, as guard ring 32 for MTL transistors, as the PNP base region 36 and to form low value N resistors (75 ohms/sq). The implant is done at low energy such that the oxide/nitride windows 18 and 18' define the doped region. A subsequent reoxidation 39 is done shown in FIG. 1e which grows slightly less than the original epi reoxidation cycle 12 and diffuses the N regions 32, 36 to contact the up-diffusing buried N+ region 6. During this oxidation step, the oxide 41 in the contact regions 22, 24, 26 will grow a lesser amount to give subsequent ion-implant energy loss approximately equivalent to the oxide 12 plus nitride 14 layers.

Figure 1E:
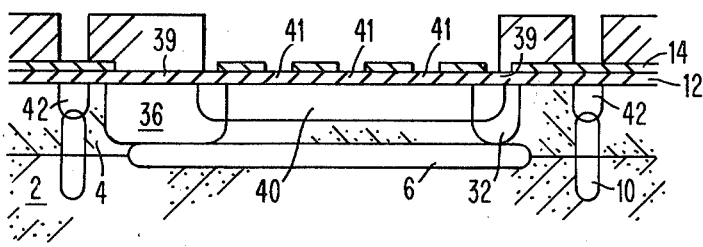
FIG. 1e is a cross-sectional view of a fourth stage, after FIG. 1d, and an intervening oxidation step, showing the NPN base photo and ion-implant, forming the NPN base, PNP collector and top isolation regions. (Note that the base region is defined by photoresist and by compensation by the N guard ring. High value resistor formation is not shown.)

In FIG. 1e, the NPN base/PNP collector region and top isolation regions 42 are then formed by a PR masked double energy boron ion-implant. Since the P regions 40, 42 are implanted through the oxide 39, 41 and oxide 12 nitride 14 layers, the base 40 junction depth will be a function of the oxide layer 41 thickness in the contact areas 22, 24, 26 and a function of oxide 12 plus nitride 14 thickness elsewhere. By keeping the nitride layer 14 thin relative to the oxide thickness 39, the differences in base 40 junction depth can be kept small and the thinning of the base region 40 at the corners of the upward collectors 54 can be minimized.

Figure 1F:
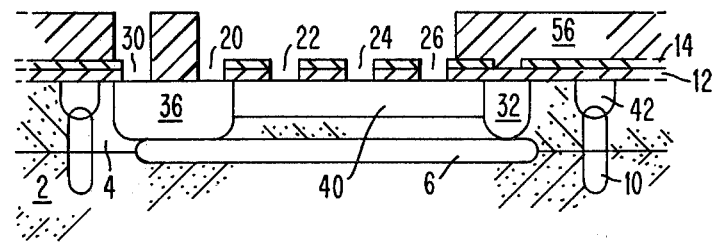
FIG. 1f is a cross-sectional view of a fifth stage, after FIG. 1e, showing the contact blocking photo, showing the formation of all contact windows. (Note contact windows defined by Si$_3$N$_4$ windows except on ends of PNP base and emitter contacts where the contact windows are defined by the photoresist layer.)

In FIG. 1f, a photoresist mask 56 is used next to block the N guard ring areas 32 while all contacts 20, 22, 24, 26, 30 are reopened in the SiO$_2$ layer 12. This mask 56 is used to define one or more sides of the reachthrough/PNP base contact window 30 and the PNP emitter window 20.

Figure 1G:
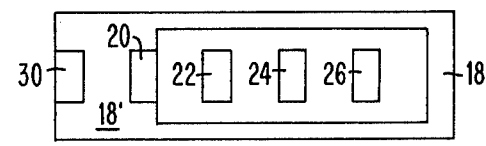
FIG. 1g is a top view after the opening of the contacts in FIG. 1f showing the definition of the contacts by the Si$_3$N$_4$ and the now removed photoresist. (Note the PNP emitter and base contacts are defined by a combination of Si$_3$N$_4$ and SiO$_2$.)

FIG. 1g shows a top view of the nitride defined windows 22, 24, 26 and the nitride/photoresist defined windows 20, 30. The previously defined Si₃N₄ openings serve as the etch mask for one or more sides of contacts 30, 20 while the block mask 56 defines the other sides.

The next two masking steps use a blocking photoresist to mask ion-implants. The order of the steps may be interchanged.

Figure 1H:
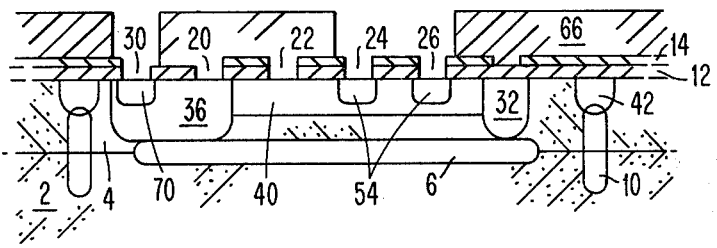
FIG. 1h is a cross-sectional view of a sixth stage, after FIGS. 1f and 1g, showing the surface N+ blocking photo and arsenic implant, forming the upward N+ collectors and the ohmic contact to the PNP base/NPN buried emitter/guard ring regions. (Note implant defined by Si$_3$N$_4$/SiO$_2$ windows.)

1. FIG. 1h shows PR mask 66 to form N+ (arsenic) NPN upward collectors 54, reachthrough/PNP base contact regions 70 (Mask 66 is a blockout and the As implant is defined by the Si₃N₄ 14, SiO₂ 12 openings).

Figure 1I:
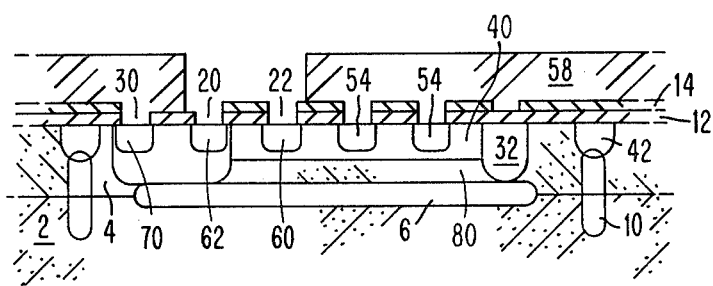
FIG. 1i is a cross-sectional view of a seventh stage, after FIG. 1h, showing the P+ emitter blocking photo and implant, forming the PNP emitter, the PNP collector/NPN base ohmic contact. (Note implant is defined by Si$_3$N$_4$/SiO$_2$ windows.)

2. FIG. 1i shows PR mask 58 to form P+ (boron) NPN base/PNP collector contact 60, PNP emitter regions 62 and P resistor contacts (Mask 58 is blockout and the implant is defined by the Si₃N₄ 14, SiO₂ 12 openings).

Following these implant steps, an anneal/drive is used to activate the implanted species and diffuse the N+ and P+ regions to the final junction depths.

Figure 1J:
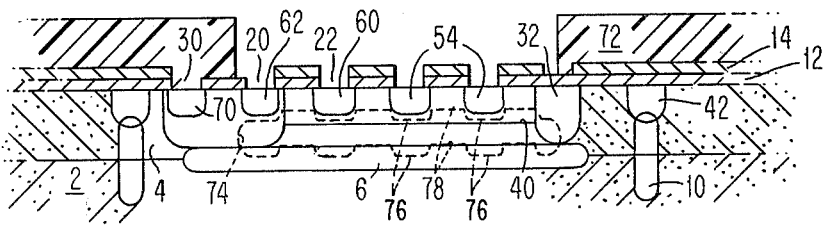
FIG. 1j is a cross-section showing the buried P implant forming the essence of this invention.

FIG. 1j shows the next step which is the essence of this invention. Blocking photoresist layer 72 is used to define a boron ion-implant layer 74. This boron layer is implanted at sufficient energy such that the peak of the boron doping profile lies at a depth approximately coincident with the edge of the upper portion of the doping profile of the up diffused N+ buried emitter 6 under the intrinsic base region 76. This profile is also made to lie midway in the N⁻ epi region between the base region 40 and the buried emitter 6 under the extrinsic base region 78 by proper choice of oxide/nitride thickness and vertical junction depths and epi thickness.

For a base junction depth of 0.5 microns, an N⁻ region thickness of 0.2 microns and an oxide/nitride thickness of 1000Å/500Å, an energy of 300 kev can be used for the boron implant. The dose can be adjusted between $10^{12}$ to $10^{14}$ cm⁻² to give the desired upward gain characteristics.

After stripping the photoresist layer 72, an anneal at 900° C. for 30 minutes in an inert atmosphere electrically activates the boron with negligible diffusion.

As long as the concentration of the boron implant 74 is kept below that of the PNP base region 36 and guard ring 32, no masking of the implant is necessary within the merged transistor structures since the guard ring isolates adjacent base regions. Photoresist layer 72 then is a non-critical mask layer which is used only to block non-MTL structures from the boron implant.

In summary, this invention provides an improved I²L structure which with a non-critically masked boron implant has an extended NPN base region with enhanced electron injection and upwardly graded base in the intrinsic region and a retarded electron injection and reduced charge storage in the extrinsic region.

While the invention has been particularly shown and described with reference to the preferred embodiments thereof, it will be understood by those skilled in the art that the foregoing and other changes in form and details may be made therein without departing from the spirit and scope of the invention.

We claim:

1. In an integrated injection logic circuit cell containing a lateral PNP transistor and a vertical NPN transistor, embodied as a buried N-type subemitter region formed between a semiconductor substrate and an N-type silicon epitaxial layer, said subemitter region extending horizontally with a first end and a second end and having an upper surface at a first depth from the upper surface of said epitaxial layer, an N-type base region formed in said epitaxial layer over said first end of said subemitter and extending vertically from said upper surface of said epitaxial layer to contact said subemitter said N-type base being contiguous to a P-type emitter, a P-type base region formed in said upper surface of said epitaxial layer over said subemitter, having a first end overlapping said N-type base region, a second end extending horizontally toward said second end of said subemitter, and a lower surface at a second depth from said upper surface of said epitaxial layer, said second depth being less than said first depth, said P-type base region serving as the base of said NPN transistor and the collector of said PNP transistor, an insulating layer on the upper surface of said epitaxial layer having a horizontal contour with first and second windows therethrough mutually spaced from each other and located over said P-type base region between said N-type base region and said second end of said P-type base region, said first window serving as an electrical contact for said P-type base region, an N-type collector region formed in said P-type base region beneath and aligned with said second window and having a lower surface at a third depth from said upper surface of said epitaxial layer, said third depth being less than said second depth, the portion of said P-type base region beneath and aligned with said N-type collector region defining an intrinsic base region and other portions of said P-type base region being an extrinsic base region; the improvement comprising:

an ion-implanted P-type region extending horizontally from said N-type base region toward said second end of said P-type base region, with the vertical profile of its dopant concentration contour having a peak which is vertically displaced from said contour of said insulating layer, said peak being located substantially at said first depth beneath and aligned with said N-type collector region to form a concentration gradient induced electric field in said intrinsic base region which aids the upward injection of electrons from said subemitter to said N-type collector, said peak being located substantially midway between said first depth and said second depth beneath portions of said P-type base region covered by said insulating layer to form a concentration gradient induced electric field in said extrinsic base region which retards the upward injection of electrons from said subemitter to said P-type base region, said dopant concentration contour compensating said N-type conductivity of said epitaxial layer beneath said P-type base region beneath said first window and said N-type base region to form a relatively large collector area for said PNP transistor to provide increased PNP collector efficiency and current gain.

2. In an integrated injection logic circuit cell containing a lateral PNP transistor and a vertical NPN transistor, embodied as a buried NPN subemitter region formed between a semiconductor substrate and an N-type silicon epitaxial layer, said subemitter region extending horizontally with a first end and a second end and having an upper surface at a first depth from the upper surface of said epitaxial layer, a PNP base region formed in said epitaxial layer over said first end of said subemitter and extending vertically from said upper surface of said epitaxial layer to contact said subemitter, said PNP base being contiguous to a PNP emitter, an NPN base region formed in said upper surface of said epitaxial layer over said subemitter, having a first end overlapping said PNP base region, a second end extending horizontally toward said second end of said subemitter, and a lower surface at a second depth from said upper surface of said epitaxial layer, said second depth being less than said first depth, said NPN base region also serving as the collector of said PNP transistor, an insulating layer on the upper surface of said epitaxial layer having a horizontal contour with first and second windows therethrough mutually spaced from each other and located over said NPN base region between said PNP base region and said second end of NPN base region, said first window serving as an electrical contact for said NPN base region, an NPN collector region formed in said NPN base region beneath and aligned with said second window and having a lower surface at a third depth from said upper surface of said epitaxial layer, said third depth being less than said second depth, the portion of said NPN base region beneath and aligned with said NPN collector region defining an intrinsic base region and other portions of said NPN base region being an extrinsic base region, the improvement comprising:

an ion implanted P-type region extending horizontally from said PNP base region toward said second end of said NPN base region, with the vertical profile of its dopant concentration contour having a peak which is vertically displaced from said contour of said insulating layer, said peak being located substantially at said first depth beneath and aligned with said NPN collector region to form a concentration gradient induced electric field in said intrinsic base region which aids the upward injection of electrons from said subemitter to said NPN collector, said peak being located substantially midway between said first depth and said second depth beneath portions of said NPN base region covered by said insulating layer to form a concentration gradient induced electric field in said extrinsic base region which retards the upward injection of electrons from said subemitter to said NPN base region, said dopant concentration contour compensating said N-type conductivity of said epitaxial layer beneath said NPN base region between said first window and said PNP base region to form a relatively large collector area for said PNP transistor to provide increased PNP collector efficiency and current gain.

* * * * *